United States Patent
Kitatani et al.

(10) Patent No.: US 6,697,405 B2
(45) Date of Patent: Feb. 24, 2004

(54) VERTICAL CAVITY SURFACE EMITTING LASERS, OPTICAL MODULES AND SYSTEMS

(75) Inventors: Takeshi Kitatani, Hachiouji (JP); Masahiko Kondow, Kodaira (JP); Toshiaki Tanaka, Cambridge (GB)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/785,480

(22) Filed: Feb. 20, 2001

(65) Prior Publication Data

US 2002/0075921 A1 Jun. 20, 2002

(30) Foreign Application Priority Data

Dec. 15, 2000 (JP) ........................................ 2000-381433

(51) Int. Cl.$^7$ ............................... H01S 3/10; H01S 5/00
(52) U.S. Cl. ............................... 372/45; 372/46; 372/47; 372/48; 372/50; 372/26
(58) Field of Search ............................... 372/45, 46, 96, 372/47, 48, 50, 26, 38.02

(56) References Cited

U.S. PATENT DOCUMENTS 5,245,622 A * 9/1993 Jewell et al. .................. 372/45
6,031,243 A * 2/2000 Taylor .......................... 257/13

FOREIGN PATENT DOCUMENTS

JP 11-204875 * 7/1999

OTHER PUBLICATIONS

Kenichi Iga et al., Advanced Optoelectronic Series, "Foundation and Application of Surface Emitting Laser", pp. 182–185 (cited in specification).

* cited by examiner

Primary Examiner—Paul Ip
Assistant Examiner—Armando Rodriguez
(74) Attorney, Agent, or Firm—Antonelli, Terry, Stout & Kraus, LLP

(57) ABSTRACT

A surface emitting laser device comprising, on a semiconductor substrate, an active region for generating light, a current confinement region disposed on the side opposite to the semiconductor substrate relative to the active region, an optical cavity comprising reflectors putting the active region and the current confinement region vertically therebetween in the direction of layering the semiconductor layer, a first electrode disposed on the side of the semiconductor substrate relative to the current confinement region and a second electrode disposed on the side opposite to the semiconductor layer relative to the current confinement region, and having a layered structure capable of forming 2-dimensional carriers between the current confinement region and the second electrode, in which a current flowing from the electrode to the current confinement region has a component in the horizontal direction relative to the surface of the substrate and is conducted mainly by way of the channel for the 2-dimensional carrier gas, whereby the device resistance can be reduced greatly to provide high speed optical module using the surface emitting laser improved in the performance operating at a high speed of 10 Gb/s or more.

18 Claims, 10 Drawing Sheets

VERTICAL CAVITY SURFACE EMITTING LASERS, OPTICAL MODULES AND SYSTEMS

BACKGROUND OF THE INVENTION

1. Field of the Invention

This invention concerns a surface emitting laser device having a vertical cavity, and an optical module and an optical system using the same.

2. Statement of the Related Art

Along with explosive increase of Internet users in recent years, high speed information transmission has been required in local area networks (LAN). It is expected that transmission rate at Gb/s level for end users and in excess of 10 Gb/s level for backbones connecting between HUBs will be required in the next 5 to 10 years. Therefore, it is considered that optical communications using optical fibers as far as end users are necessary in the near future. Usually, for optical communication, semiconductor lasers, photodetectors and optical modules incorporating driving circuits therein are used. In optical modules to be used in future LAN, it is indispensable that these optical modules are provided at a reduced cost for use by a great number of users. In addition, high speed transmission performance in excess of 10 Gb/s must be possible.

FIG. 1 shows a schematic view for a high speed optical module in excess of 10 Gb/s known so far.

As shown in FIG. 1, the optical module comprises a semiconductor laser device 401, a laser driving circuit 402, an external modulator 403, a TEC (Thermo Electric Cooler) for stabilizing the temperature for the device 404, a photodetector 405, a photodetector driving circuit 406, an entire optical module package 407, an external circuit 408 for operating the optical module, and an optical fiber 409. The optical module generates a laser beam from the semiconductor laser device 401 in accordance with the external circuit 408. The high-speed modulated light in excess of 10 Gb/s is transmitted through the external modulator 403. Further, optical signals transmitted from a mating optical module is received by the photodetector 405. All the optical signals are transmitted and received through the optical fiber 409. As the semiconductor laser device 401, an edge emitting laser using gallium indium phospho arsenide (GaInPAs) series semiconductor material for the active layer is mainly used. The laser beam wavelength is at 1.3 μm or 1.55 μm applicable to a single mode fiber capable of long distance and high speed transmission.

Generally, the GaInPAs series laser has a drawback that a threshold current increases remarkably when a device temperature increases. Accordingly, it has been necessary to incorporate a temperature stabilizing thermoelectric cooler. As described above, the number of parts constituting the optical module is large and, therefore, the size of the module is large and the cost of the optical module itself is expensive. This is a concern in that the existent level of transmission rate of 10 Gb/s has been mainly used in trunk transmission networks in which performance rather than the cost is emphasized. In view of the above, existent 10 Gb/s optical module is not essentially suitable for the application to future LANs which require cost reduction. The dotted lines in FIG. 1 denote partitioning between the light transmission side in which a semiconductor laser device is disposed and a light receiving side in which the photodetector is disposed, and each of the portions may serve as an optical transmission module and an optical receiving module independently. Further, the photodetector for optical output monitor of semiconductor laser device is omitted.

Recently, a surface emitting laser has attracted attention as a light source suitable for use as a high speed optical module for future LANs. The surface emitting laser has a cavity length as small as several μm which is much shorter when compared with the cavity length (several hundreds μm) of the edge emitting laser and is basically excellent in high speed characteristics. Further, the surface emitting laser also has excellent features in that (1) the beam shape is nearly circular which is easily coupled with an optical fiber (2) a cleaving step is not necessary in the production step and device check is possible on the wafer and (3) the laser oscillation is conducted at a low threshold current and consumes less electric power to reduce the cost. As for the lasing wavelength, the lasing operation at 1.3 μm range by using new semiconductor materials which can be formed on a gallium arsenide (GaAs) substrate such as of gallium indium nitrogen arsenide (GaInNAs) or gallium arsenic antimonate (GaAsSb) have been reported successively in recent years.

For the semiconductor laser devices, it has been expected that more and more practical surface emitting lasers in a long wavelength range are adaptable to a single mode fiber for long distance and high speed transmission. Particularly, it is expected that when GaInNAs is used for the active layer, electrons can be confined in a deep potential well in the conduction band and the stability of the temperature characteristics can also be improved drastically. It has been expected for the long wave range surface emitting laser device using GaInNAs as the active layer that it can provide an optical module of high performance, at a reduced cost and suitable to use in LANs based on the foregoing advantages.

The surface emitting laser basically comprises an active layer for generating light, a current confinement layer for injecting current to a minute region of the active layer and an optical cavity comprising a pair of reflectors disposed so as to vertically put the active layer therebetween. Usually a semiconductor Distributed Bragg Reflector (DBR) is used as a reflector and the current is injected by way of a semiconductor DBR layer into the active layer.

Since the semiconductor distributed Bragg reflector (DBR) has high resistance, a surface emitting laser of a different structure in which current is injected not by way of the reflector has also been studied. An example is a surface emitting laser as described in Japanese Patent Laid-Open Hei 11-204875 (laid-open on Jul. 30, 1999). FIG. 2 shows a device structural view of a surface emitting laser. As shown in FIG. 2, the surface emitting laser comprises a lower electrode 501, a semiconductor substrate 502, a lower DBR 503, a first spacer layer 504, an active layer 505, a 20 second spacer layer 506, a current confinement layer 507, a current induced layer 508, a third spacer layer 509, an upper electrode 510 and an upper DBR 511. Since the upper electrode 510 is disposed on the side of the upper DBR 511, the induced current from above is introduced from the third spacer layer 509 through the current induced layer 508 to the aperture restricted by the current confinement layer 507 and then introduced into the active layer 505. That is, since the current is induced not by way of the upper DBR 511, the device resistance can be reduced. Further, in this structure, the current induced layer 508 with an increased doping concentration is adopted intending to reduce the resistance to the horizontal direction relative to the substrate between the electrode and the aperture (hereinafter referred to as a resistance to the lateral direction).

OBJECT AND THE SUMMARY OF THE INVENTION

This invention intends to provide a surface emitting semiconductor laser device capable of high speed operation.

High speed operation, for example, above 10 Gb/s is attained in accordance with this invention.

This invention further intends to provide a surface emitting semiconductor laser device capable of high speed operation and reduction in cost.

This invention further provides an optical module incorporating the surface emitting semiconductor laser device capable of higher speed operation.

For coping with such technical subjects, it is necessary to overcome the foregoing problems in the surface emitting laser. At first, a surface emitting laser device structure capable of injecting current to an active region not by way of an upper DBR of high resistance should be adopted. For this purpose, it is necessary to provide a new method capable of reducing the resistance in the lateral direction of the current passing from the electrode through the aperture and injected into the active region and attain a drastic reduction of the device resistance to about 10 Ω.

A typical embodiment of this invention resides in a surface emitting laser device comprising, on a semiconductor substrate, an active region for generating light, a current confinement region disposed on the side opposite to the semiconductor substrate while putting the active region therebetween, an optical cavity comprising reflectors putting the active region and current confinement region vertically therebetween in the layering direction of the semiconductor layer, a first electrode disposed on the side of the semiconductor substrate and a second electrode disposed on the side opposite to the semiconductor substrate while putting the current confinement region therebetween, and having a semiconductor region having a layered structure capable of forming 2-dimensional carriers between the current confinement region and the second electrode.

The semiconductor region having the layered structure capable of forming the 2-dimensional carriers is preferably adapted for the purpose of this invention, particularly, the so-called modulation doped structure. That is, the second embodiment of this invention is a surface emitting laser device having, on a semiconductor substrate, an active region for generating light, a current confinement region disposed on the side opposite to the semiconductor substrate relative to the active region, an optical cavity comprising reflectors putting the active region and the current confinement region vertically therebetween in the direction of layering the semiconductor layer, a first electrode disposed on the side of the semiconductor substrate relative to the current confinement region and a second electrode disposed on the side opposite to the semiconductor layer relative to the current confinement region, and having a layered structure capable of forming 2-dimensional carriers between the current confinement region and the second electrode and the semiconductor region having the layered structure capable of forming td the 2-dimensional carriers has at least a first semiconductor layer containing impurities at high concentration and having a wide band gap and a second semiconductor layer containing impurities at a concentration lower than that of the first semiconductor layer or substantially not containing impurities and having a band gap narrower than that of the first semiconductor layer.

The semiconductor region having the layered structure capable of forming the 2-dimensional carriers provide the effect thereof so long as it is present in at least a portion between the current confinement region and the second electrode. In the example to be described later, the semiconductor region having the layered structure capable of forming the 2-dimensional carriers is formed substantially over the entire surface of the substrate surface. More actual embodiment in the practical production is explained but it is important that the layered structure capable of forming the 2-dimensional carriers is present in a current path between the current confinement region and the second electrode. In the other point of view, a region having a layered structure capable of forming the 2-dimensional carriers constitutes a main portion of the current channel. Accordingly, it is not always necessary to form a layered structure capable of forming the 2-dimensional carriers entirely for the surface in parallel with the substrate surface. Further, other semiconductor layer may be further disposed between the layered structure capable of forming the 2-dimensional carriers and the current confinement region. Also in this case, the effect by disposing the layered structure capable of forming the 2-dimensional carriers can also be obtained.

As described above, in the basic constitution of this invention in which a current flowing from the electrode disposed on the side opposite to the substrate relative to the current confinement region has a horizontal component relative to the substrate, the current component in the horizontal direction is conducted mainly by way of the 2-dimensional carrier gas channel. Specifically, it is attained by a surface emitting laser device wherein the 2-dimensional carrier gas channel is formed of a modulation dope structure in which at least one kind of high concentration dope layer comprising a semiconductor of a wide band gap and at least one low concentration dope layer comprising a semiconductor with a narrower band gap than that (the low concentration dope layer may also include the case of not applying doping) are located in at least a portion between the electrode and the current confinement region.

For attaining the main purpose of this invention as described above, reduction of the resistance in the surface emitting laser device due to p-type conduction is intended and a 2-dimensional hole gas mainly as the carriers is used.

PREFERRED EMBODIMENT OF THE INVENTION

The basic constitution of this invention is as has been described above and main preferred embodiments of this invention will be set forth below.

A first embodiment according to this invention is a surface emitting laser device having, on a semiconductor substrate, an active region generating light, a current confinement region disposed on the side opposite to the substrate relative to the active region and an optical cavity comprising reflectors putting the active region and the current confinement region vertically therebetween, in which the current flowing from the electrode disposed on the side opposite to the semiconductor substrate relative to the current confinement region has a horizontal component relative to the surface of the substrate and the current component in the horizontal direction flows mainly by way of the channel for 2-dimensional carrier gas.

The second embodiment of this invention is a surface emitting laser device as defined in the first embodiment, wherein the 2-dimensional carrier gas channel is formed of a modulation dope structure of in which at least one kind of high concentration dope layer comprising a semiconductor of wide band gap and at least one kind of low concentration dope layer comprising a semiconductor with a narrow band gap than that (also including a case of not applying doping) are located in at least a portion of the electrode and the current confinement region.

A third embodiment of this invention is a light emitting laser device as defined in the second embodiment wherein absorption of the laser wavelength beam by the modulation dope structure is less than 1%, and the modulation dope structure is disposed including the inside of the cavity through which the beam travels. Even when the modulation dope structure is incorporated in the optical cavity, it can be driven sufficiently in the same manner as usual surface emitting laser device so long as the absorption of the laser beam in the structure is less than 1%. Such a problem of laser beam absorption can naturally be avoided by disposing the modulation dope structure to the outside of the optical cavity as exemplified below.

A fourth embodiment according to this invention is a surface emitting laser device as defined in Embodiment 2, wherein the modulation dope structure is disposed to the outside of a light propagating cavity.

A fifth embodiment according to this invention is a surface emitting laser device as defined in any one of Embodiment 1 to 4, wherein the high concentration dope layer in the modulation dope structure is p-type and 2-dimensional carrier gas is comprises holes.

A sixth embodiment according to this invention is a surface emitting laser device as defined in any one of Preferred Embodiments 2 to 5, wherein AlGaAs, AlGaInP or layered structure thereof is used in the high concentration dope layer, and GaAs, GaInAs or layered structure thereof is used for the low concentration dope layer. The group III–V compound semiconductor materials set forth here are materials extremely suitable to the practice of this invention. Such materials can easily form high quality layers on a GaAs substrate capable of easily providing excellent characteristic with a view point of the surface emitting laser device.

Prior to explanation for more preferred embodiments, details for basic concept of this invention is to be additionally explained.

Prior to the description for concrete embodiments, details for the basic concept of this invention is additionally explained.

For attaining an optical module having a high speed operation characteristic in excess of 10 Gb/s, it is naturally necessary to attain high speed characteristic in excess of 10 Gb/s in a surface emitting laser used as a light source. For this purpose, it is indispensable to reduce the resistance (R) the capacitance (C) of the surface emitting laser device.

Generally, the basic modulation characteristic of a semiconductor laser device is evaluated by a modulation frequency at which the optical output of the device is lowered by 3 dB (hereinafter simply referred to as f3 dB). Then, f3 dB is represented by using R and C in accordance with the following equation (1)

$$f3\ dB = 1/(2\pi R \cdot C) \qquad (1)$$

The fact described above is explained, for example, in Advanced Optoelectronic Series "Foundation and Application of Surface Emitting Laser", page 184, written by Kenichi Iga and Fumio Koyama, published from Kyoritsu Shuppan.

From the equation (1) above, it is understood that the device resistance should be reduced to about 10 Ω in order to attain several 10 Gb/s for f3 dB of the device. In this case, the capacitance of the surface emitting laser device is assumed to 500 fF as a general value. If the device capacitance can further be reduced, the allowable amount for the device resistance can be increased, for example, 10 Ω or more but it would be appreciated that reduction of the resistance is important also in this case. Further, the device resistance of about 110 is a low value comparable with that of the edge emitting laser and, if it can be attained, laser driving circuits and the like used so far in the edge emitting laser are applicable. In this case, new development cost is not required, which is advantageous in the reduction of the cost for the optical module using the surface emitting laser device according to this invention.

<Comparative Discussion with Prior Art>

As has been described previously, a reflector comprising AlAs/GaAs series semiconductor multi-layered film (DBR) has been used mainly in the surface emitting lasers. In the existent device, an electrode is disposed on the DBR comprising a p-type AlAs/GaAs and current is injected through the DBR into the active layer. In this instance, there is a problem that the energy difference at the hetero interface of an AlAs/GaAs series semiconductor provides a large resistive ingredient for holes of heavy effective mass to increase the device resistance. As a countermeasure, it has been attempted, for example, to introduce an AlGaAs semiconductor layer of gradually changed content to the AlAs/GaAs hetero interface, apply p-type doping only on the AlAs side thereby decreasing the resistive ingredient at the hetero interface. However, since the resistance of the p-type AlAs/GaAs series semiconductor DBR is essentially high, it is difficult to attain drastic reduction of the device resistance.

On the other hand, the surface emitting laser described in Japanese Patent Laid-Open Hei 11-204875 (laid-open on Jul. 30, 1999) described previously is to be studied. This example has a structure of injecting current not by way of an upper p-type semiconductor DBR of high resistance.

The resistance to the lateral direction is in proportion with the sheet resistance (Rc). Rc is represented by the following equation (2).

$$Rc = 1/(Ns \cdot e \cdot \mu) \qquad (2)$$

wherein Ns represents a sheet•carrier concentration, e represents an elementary electric charge, $\mu$ represents a layer mobility and t represents the thickness of the layer. Ns is represented as a product of carrier concentration (p) and the mobility ($\mu$) of the layer (Ns=p$\mu$).

DESCRIPTION OF ACCOMPANYING DRAWINGS

Figure 1:
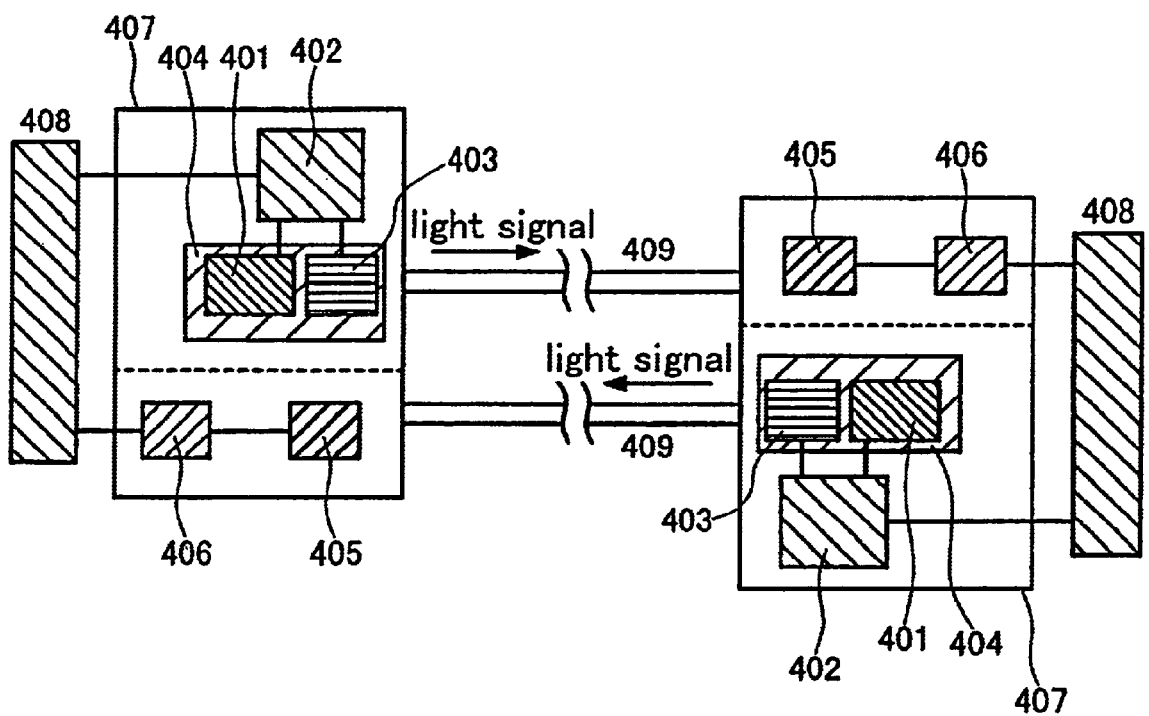
FIG. 1 is a schematic explanatory view illustrating an example optical system.
Figure 2:
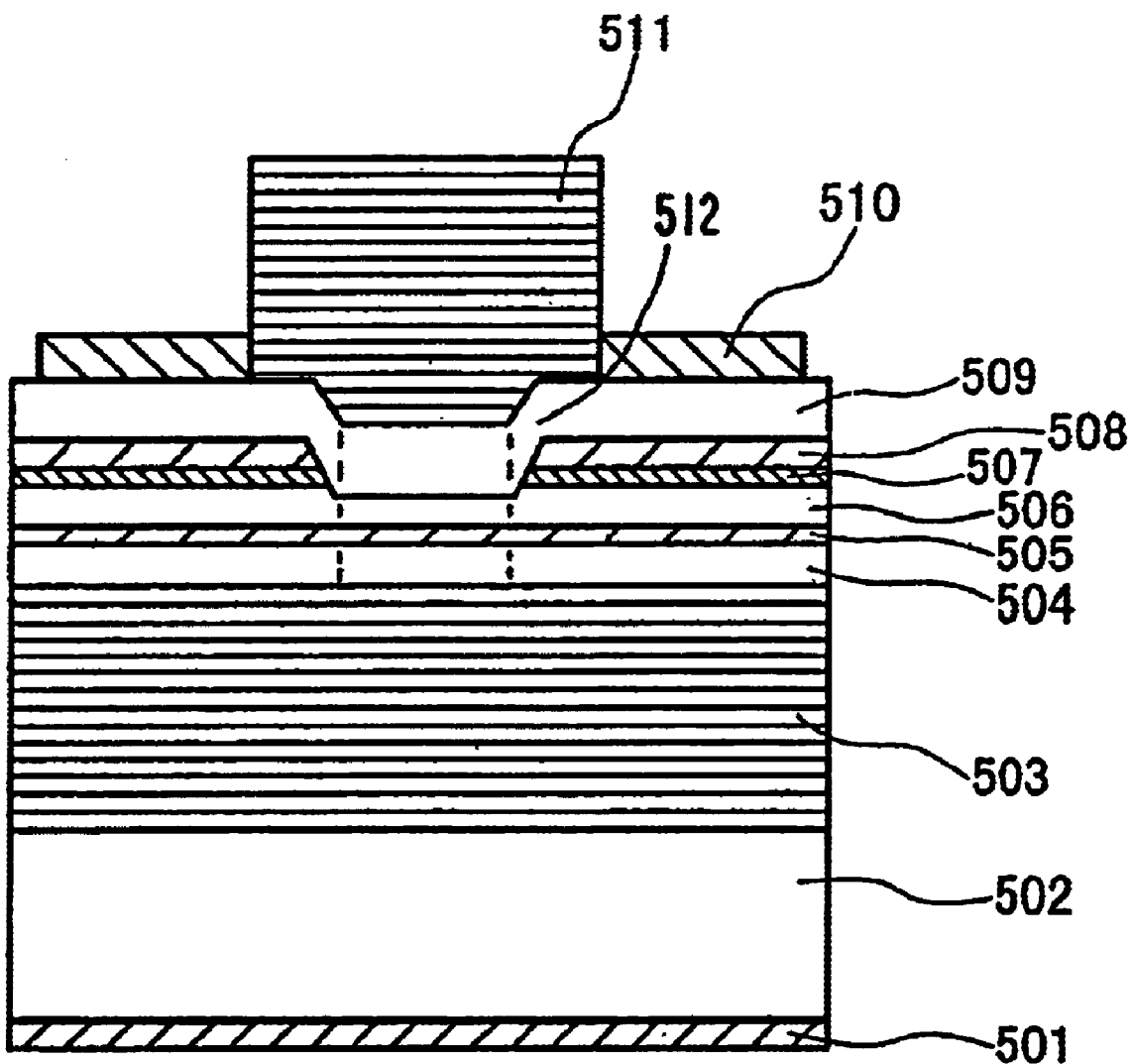
FIG. 2 is a cross sectional view illustrating an example surface emitting laser device.

In the example surface emitting laser device shown in FIG. 2, a usual semiconductor film is used for the current induced layer 508. In the semiconductor film, there exists a trade off relation that when carrier concentration p (that is, sheet carrier concentration Ns) increases, scattering factor depending on the doping material or the like increases and $\mu$ is lowered. Accordingly, the existent structure shown in FIG. 2 can not attain remarkable reduction of the device resistance unless high concentration doping at $1 \times 10^{20}$ cm$^{-3}$ or higher is applied. Furthermore, for burying the current confinement layer 507 and the current-induced layer 508 in the device, regrowth process is required additionally. When the third spacer layer 509 is regrown, if the step at the aperture after removing the current confinement layer 507 and the current induced layer 508 is large, undesired effects are provided in that the facet is formed to the step and extends to the aperture of only several $\mu$m diameter. According to the estimation, 300 nm or more of the step in the thickness is caused upon attaining the device resistance of about 10 $\Omega$ in this structure. Accordingly, with a view point of crystal growth as described previously, it is considered very difficult to attain the aimed device resistance value.

<Typical Embodiments of this Invention>

Figure 3:
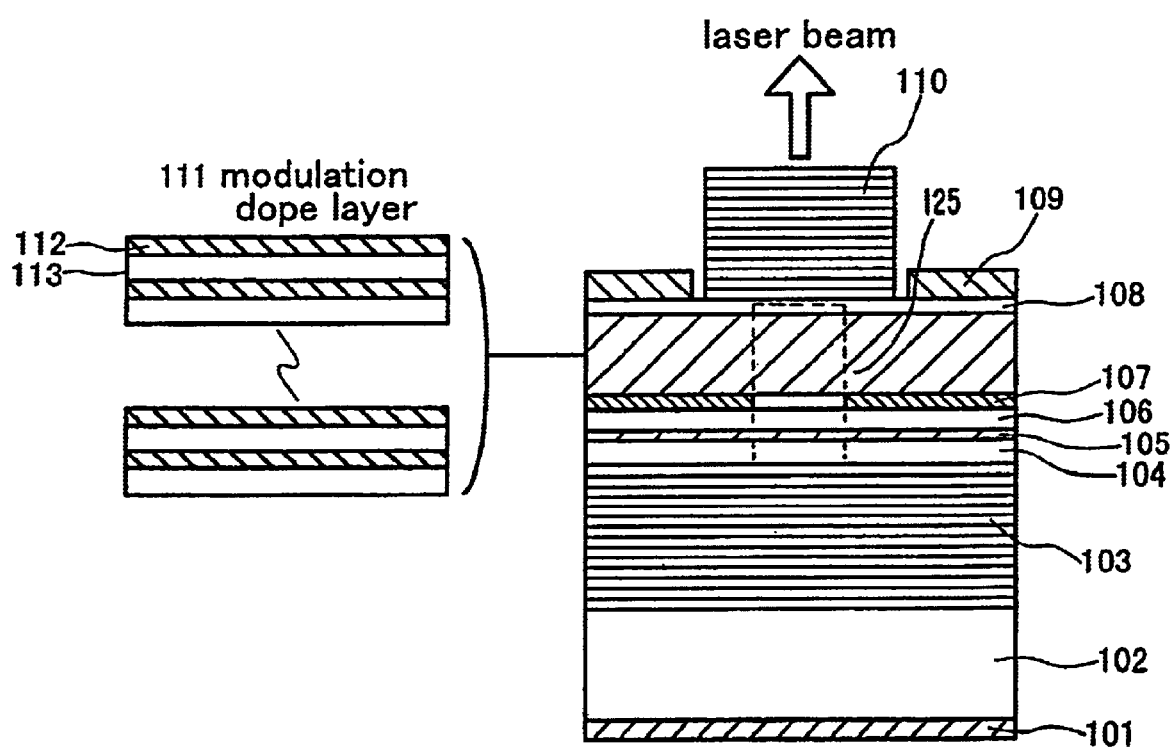
FIG. 3 is a cross sectional view illustrating an example surface emitting laser device according to an embodiment of the present invention.
Figure 4:
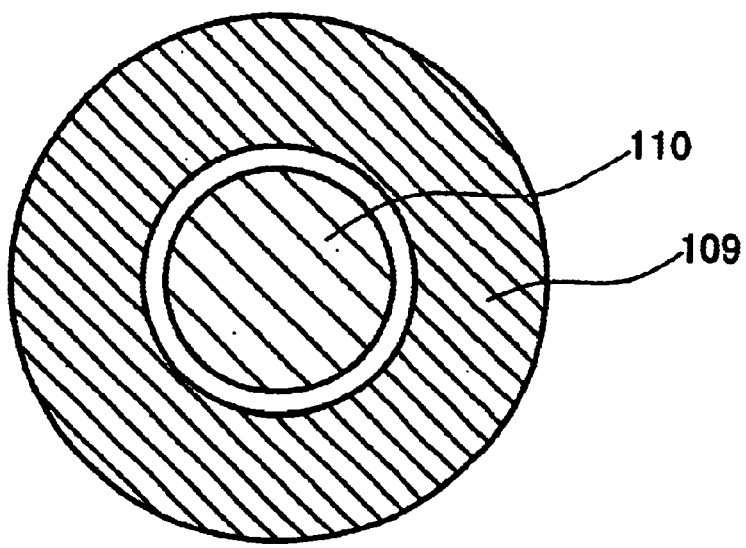
FIG. 4 is an upper plan view illustrating an example surface emitting laser device according to an embodiment of the present invention.

Embodiments of this invention free from the difficulties in the examples described above are to be explained more in details. FIG. 3 shows a cross sectional view of a device structure according to this invention. In this case, a so-called modulation dope layer 111 is specifically shown being enlarged on the left of the drawing. FIG. 4 is an upper plan view thereof.

In FIG. 3, the surface emitting laser device according to the invention comprises a lower electrode 101, a semiconductor substrate 102, a lower DBR 103, a first spacer layer 104, an active region 105, a second spacer layer 106, a current confinement layer 107, a third spacer layer 108, an upper electrode 109, an upper DBR 110, a modulation dope layer 111, a high concentration dope layer 112, and a low concentration dope layer 113. The layer 113 is not applied with doping depending on the case and reference numeral 113 also may include such a layer. A method of forming the current confinement layer 107 may be in accordance with the usual method. An example is to be described later.

For the modulation dope layer, a constitution adopted in the relevant field of the art may be used. Concrete specifications for the layer is selected, for example, by required specifications to the selection of the III–V group compound semiconductor materials and the laser characteristics, and typical examples thereof are as shown below. For example, in the surface emitting laser device using GaAs as the substrate, a typical example of the high concentration dope layer is, for example, AlGaAs, AlGaInP or a combined structure thereof. For the high concentration dope layer, a thickness of 50 nm or less, preferably, 10 nm or less and the doping amount, for example, of $5 \times 10^{18}$ cm$^{-3}$ or more are often used. On the other hand, for the low concentration dope layer, typical example is, for example, GaAs, GaInAs or a combinrd structure thereof. For the low concentration dope layer, a thickness of 100 nm or less and a doping amount, for example $5 \times 10^{17}$ cm$^{-3}$ or less are often used.

In the modulation dope layer 111, carriers supplied from the high concentration dope layer 112 flow through the channel for 2-dimensional carriers of high mobility formed at the interface between the high concentration dope layer 112 and the low concentration dope layer 113, on the side of the low concentration dope layer 113. Accordingly, the carrier concentration p can be increased by increasing the doping amount in the high concentration dope layer 112 in which the mobility $\mu$ is scarcely lowered. Accordingly, the values for respective carrier concentration p and the mobility $\mu$ can be set to high values independently of each other. Therefore, as can be seen from the equation (2) above, Rc can be reduced remarkably.

In the example surface emitting laser device shown in FIG. 2, when the thickness of the current induced layer is doubled, only the twice resistance reducing effect can be obtained. However, in this invention, since channels for the two dimensional carriers are formed by the number of three to the hetero interface when the modulation dope structure is repeated for two periods, an effect of more than simply doubling the effect can be obtained. For the repetitive number of periods for the modulation dope structure (s), the number of channel formed is (2s−1) and the obtained effect is greater as the number of repetitive periods of the modulation dope structure increases. Based on the effect described above, the resistance to the lateral direction of the emitting laser device can be reduced remarkably by using the structure according to this invention. The repetitive period(s) for the modulation dope structure is determined depending on the doping concentration and considering the extent of lowering of the reflectivity of DBR.

In the device structure according to this invention, current injected from the upper electrode 109 is passed through the aperture formed in the current confinement layer 107 and is injected to the active region. The current in this case has a component in the horizontal direction relative to the substrate surface. In this case, the current component in the horizontal direction flows by way of the 2-dimensional carrier channel at low resistance formed by the modulation dope layer. For injecting the carriers reaching above the aperture to inject into active region, it is somewhat necessary that the carriers are conducted in the vertical direction relative to the substrate surface. However, in this invention, since the thickness of the high density doping layer with wide band gap as the barrier to the carriers is as thin as 50 nm or less, and since an electric field due to the voltage difference is applied between the upper and the lower electrodes, there is scarce possibility that particularly large resistance component is added.

Figure 6:
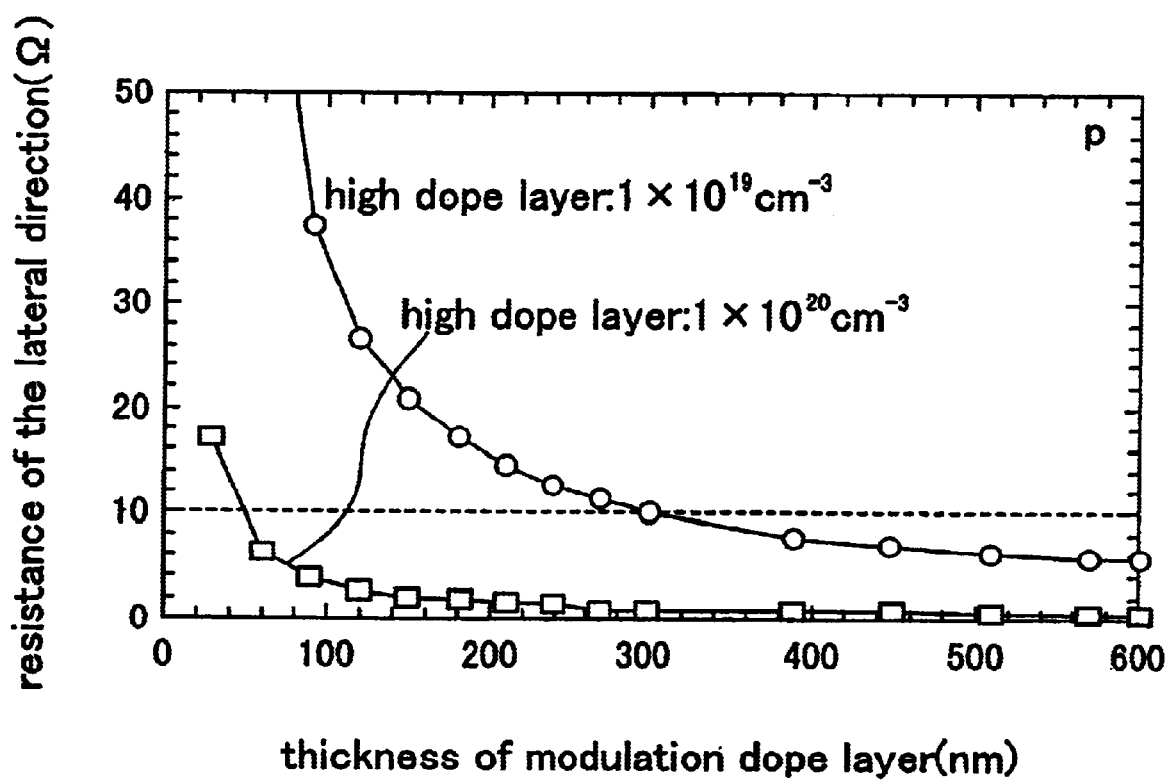
FIG. 6 is a graph illustrating a thickness of a modulation dope layer according to an embodiment of the present invention and a resistance value in the lateral direction.

FIG. 6 shows an example of a resistance in the lateral direction of a device attainable in accordance with this invention. It may be considered that the resistance of this device structure is mainly dominated by the resistance to the lateral direction. In FIG. 6, the thickness of the modulation dope layer is expressed on the abscissa, while the resistance value in the lateral direction of the layer is indicated on the ordinate. The structure of the modulation dope layer comprises p-type aluminum gallium arsenide (AlGaAs, 5 nm film thickness) as the high concentration dope layer and a non-doped GaAs (film thickness 25 nm) as the low concentration dope layer. Accordingly, the thickness of the minimum unit structure forming one channel is 30 nm. This is an example of calculation for the two types of $1 \times 10^{19}$ cm$^{-3}$ and $1 \times 10^{20}$ cm$^{-3}$ as the p-type doping concentration of the high concentration dope layer. In this case, it is estimated that the sheet carrier concentration of holes are $1 \times 10^{13}$ cm$^{-2}$ and $1 \times 10^{14}$ cm$^{-2}$, respectively, and the hole mobility in the 2-dimensional channel is 500 cm$^2$/Vsec. It can be seen from FIG. 6 that resistance in the lateral direction of 10 Ω or less can be attained in a case of the carrier concentration at 1×10$^{19}$ cm$^3$ of the high concentration dope layer if the thickness of the modulation dope layer is about 300 nm or more. On the other hand, when the carrier concentration of the high concentration dope layer is 1×10$^{20}$ cm$^3$, a further reduction of the resistance is possible and a resistance in the lateral direction of 10 Ω or lower can be attained at a thickness of about 50 nm.

Then, additional description will be made to the constitution of the reflector and the current confinement layer. Also in this invention, customary techniques used so far may be used for the reflector and the current confinement layer.

As has been described above, the length of the optical cavity of the surface emitting laser is remarkably short, and it is necessary to increase the reflectivity of upper and lower reflectors In order to reduce the threshold current value upon lasing operation. For obtaining a threshold current value served for practical use, it is necessary to provide a reflectivity of about 99.5% or more.

As the reflector, a DBR formed by alternately stacking two kinds of semiconductors of different refractive indexes at ¼ wave length thickness (λ/4n: λ represents wavelength and n representing refractive index of the semiconductor material) has mainly be used. For the two kinds of semiconductor materials used for the DBR, it is desirable that the difference of the refractive index between both of them is as large as possible so as to obtain a high reflectivity with a small number of stacking periods. Further, when the material comprises semiconductor crystals, it is preferably lattice matched with the substrate material for suppressing missfit dislocations. At present, DBRs constituted with GaAs/aluminum arsenic (AlAs) series semiconductor material or dielectric material such as silicon dioxide (SiO$_2$)/titanium dioxide (TiO$_2$) is used mainly. Further, the current confinement layer is essential for reducing the threshold current of the device and forming a single mode, which is located at an optional position between the active layer and the current injecting electrode and serves to restrict the current injected to the active layer to a minute region of several μm to several tens μm (hereinafter referred to as aperture). Specifically, a method of selectively oxidizing AlAs layer introduced into the device structure from the lateral direction and converting it into an aluminum oxide (Al$_x$O$_y$) dielectric layer thereby confining the current only within the minute AlAs region left at a central portion and a method of confining the current by burying a semiconductor material with a large band gap or a material doped to a conduction type opposite to the conduction type in the device into the device are predominant at present.

Figure 7:
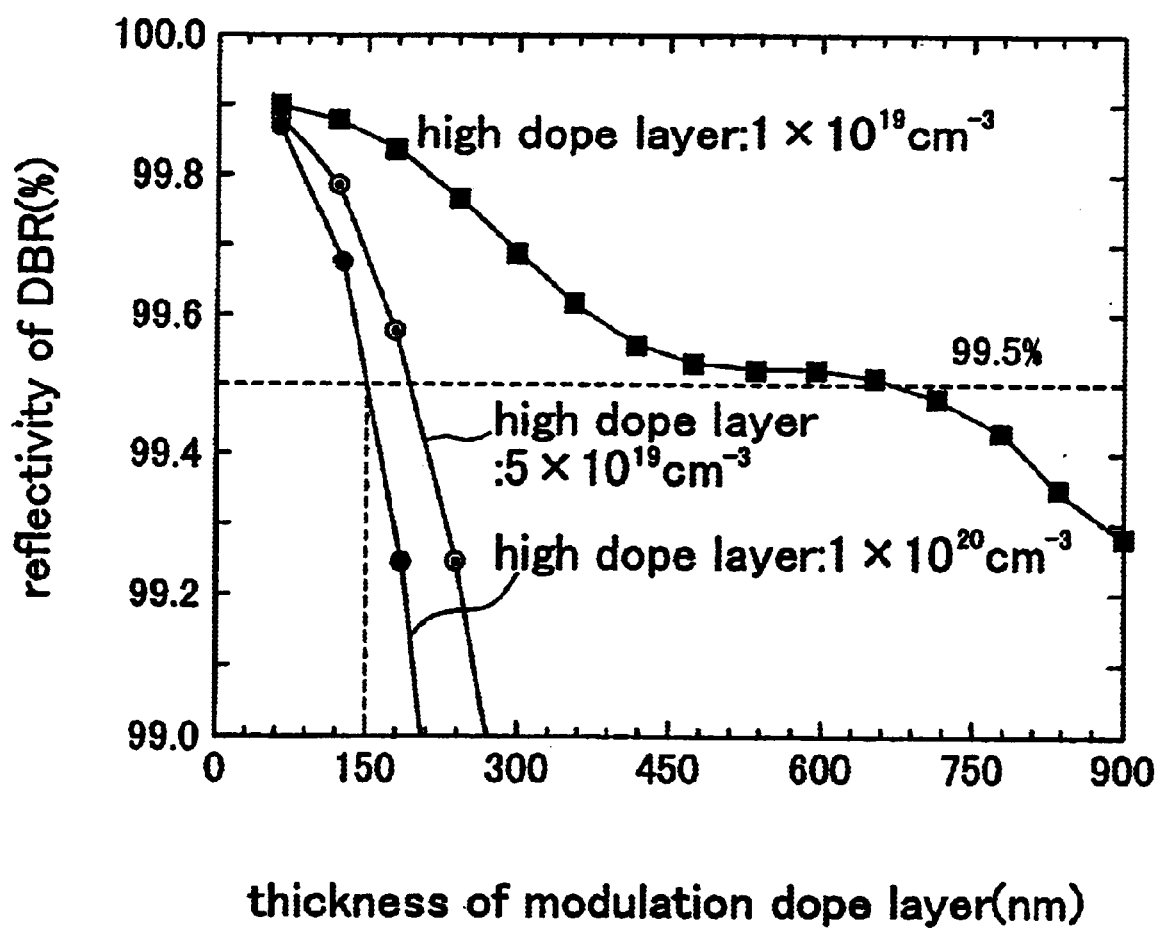
FIG. 7 is a graph illustrating a relation between a film thickness of a modulation dope layer and a reflectivity in a reflector according to an embodiment of the present invention.

Then, considering that the lasering wavelength of the laser beam is a 1.3 μm, absorption of light at wavelength of 1.3 μm by the modulation dope layer was examined. FIG. 7 shows an example of the thickness of the modulation dope layer and the change thereby of the reflectivity of the reflector thereby. The structure of the modulation dope layer is identical with that of the example in FIG. 6. the abscissa represents the thickness of the modulation dope layer and the ordinate represents the reflectivity of the DBR reflection film. Absorption of light at a wavelength of 1.3 μm mainly occurs in the p-type high concentration dope layer. This is calculated for the cases of the p-type dope concentration at 10×10$^{19\ cm-3}$ and 5×10$^{19\ cm-3}$ and 1×10$^{20}$ cm$^{-3}$ respectively. Values for the absorption coefficient under each of the conditions are 100 cm$^{-1}$, 500 cm$^{-1}$ and 1000 cm$^{-1}$ respectively. As has been described previously, a reflectivity of 99.5% or higher is necessary for ensuring high performance laser characteristic in the surface emitting laser.

As can be seen FIG. 7 that the critical thickness is about 600 nm for the p-type doping concentration 1×10$^{19}$ cm$^{-3}$ and about 150 nm for the p-type concentration 600 nm, for ensuring this reflectivity.

Accordingly, considering the results of FIG. 6 and FIG. 7 together, it has been found that there is no problem in this invention even when the modulation dope layer is disposed in the cavity upon attaining the device resistance of about 10 Ω in view of the absorption of the laser beam.

Thus, the growth process which was indispensable in the existent structure, for example, shown in FIG. 2 is no more necessary in the structure of this invention and the entire device structure can be obtained by the crystal growth for once. Accordingly, by the use of the structure according to this invention, since the yield is high upon manufacture of the device, a remarkable reduction of the cost can be attained.

On the other hand, if it is intended to completely avoid absorption of light by the high concentration dope layer, the modulation dope structure may be disposed out of the cavity. While the regrowth process is necessary in this case, the step of the film thickness step formed at the aperture can be decreased than that in the existent method shown in FIG. 2 and problems due to regrowth less occurs.

Figure 5:
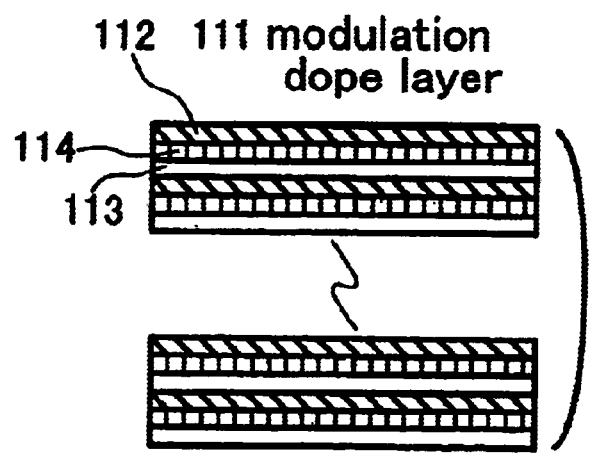
FIG. 5 is a cross sectional view illustrating another embodiment of a modulation dope layer.

For further obtaining a greater effect in this invention, it is effective to increase the sheet carrier concentration Ns. For this purpose, it is effective to insert a semiconductor material, for example, gallium indium arsenide (GaInAs) of narrow band gap as a low concentration dope layer to the AlGaAs/GaAs interface constituting the modulation dope structure. That is, it is effective to make the modulation dope structure as a plural semiconductor layered structure. This can increase the channel width (thickness) for 2-dimensional carriers to increase the sheet concentration Ns. FIG. 5 shows an example of a cross sectional view of a modified modulation dope layer, in which are shown a high concentration dope layer 112, a low concentration dope layer 113 and a low concentration dope layer 114 of narrow band gap.

Considering the forogoings, this invention is applicable also to a surface emitting laser structure at a wavelength of 1 μm or less. In this case, for suppressing the absorption of the laser wavelength beam, it is necessary to select the semiconductor material constituting the modulation dope structure from those having a larger band gap than the photon energy at the laser wavelength beam. For example, AlGaAs or AlGaInP of high Al content is suitable.

Figure 8:
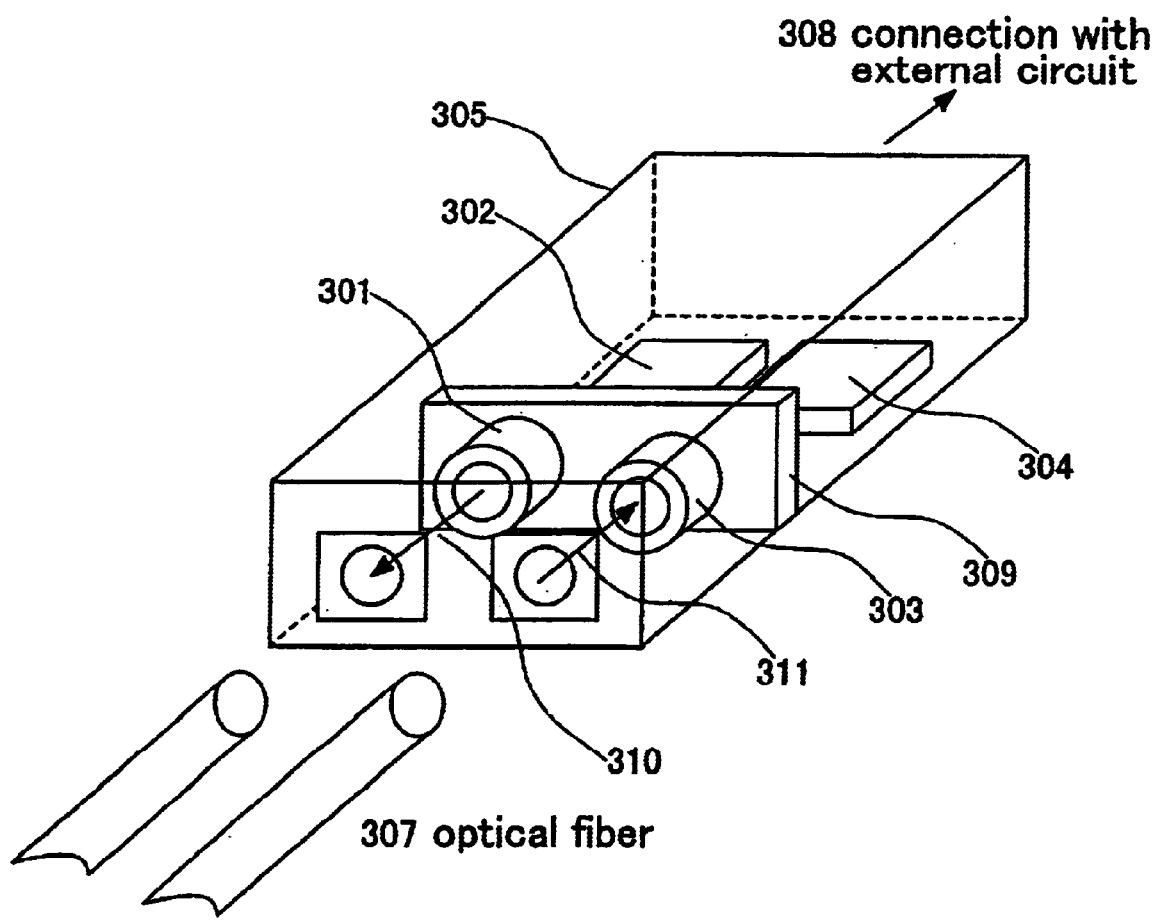
FIG. 8 is a perspective view illustrating an example optical module according to an embodiment of the present invention.
Figure 9:
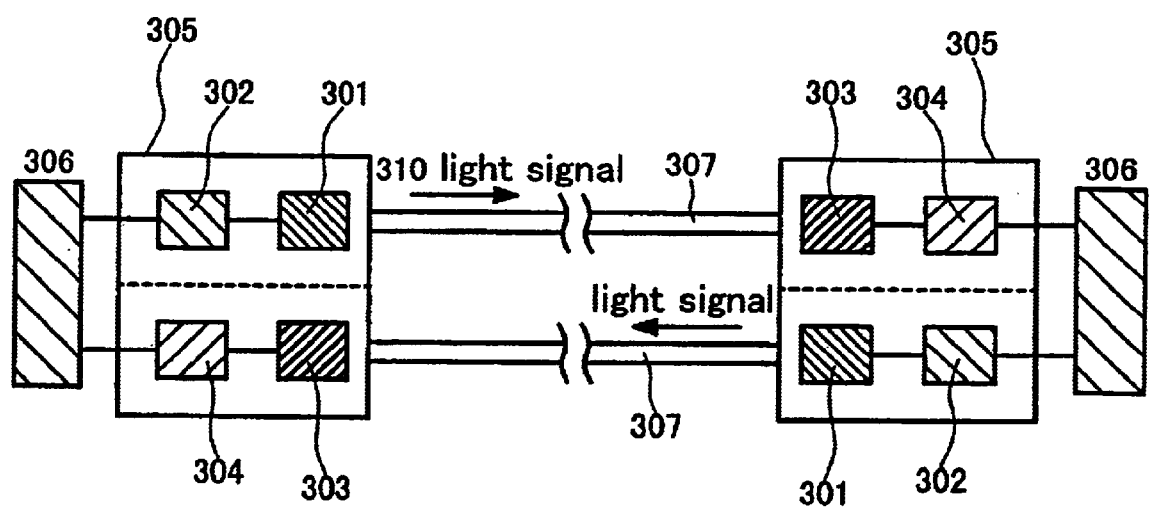
FIG. 9 is a schematic perspective view illustrating an example optical system according to an embodiment of the present invention.

FIG. 8 shows a perspective view of an optical module. FIG. 9 shows a constitutional view of an optical system using a surface emitting laser according to this invention. In FIG. 8 and FIG. 9, a surface emitting laser device 301 according to this invention, a laser driving circuit 302, a photodetector 303, a photodetector driving circuit 304, an entire optical module package 305, an external circuit 306 for operating the optical module, and an optical fiber 307 are shown. The surface emitting laser device 301 and the photodetector 303 are held on a frame 309. Each of the driving circuit and the like in the optical module package is connected at 308 to an external circuit. Arrows 310 and 311 represent emission and incidence of light respectively.

The surface emitting laser according to this invention generates less heat and fluctuates less in the temperature of the device itself since the device resistance is low. In addition, change of the threshold current value during use is extremely decreased also in cooperation with the reduction of the threshold current value of the surface emitting laser itself. This can eliminate the use of a thermoelectric cooler required in the existent high speed optical module. Further, the device can be driven by a small and simple circuit. Further, since the surface emitting laser device is directly driven under modulation, use of an external modulator is not required as well. From the foregoings, the number of parts can be decreased remarkably and the size of the driving circuit can be reduced. Accordingly, the size of the optical module itself can be reduced and remarkable cost down can be obtained together. Further, high yield upon manufacture of the device is also effective to the reduction of the cost.

Further, since the optical module according to this invention less deteriorates the active layer because of low resistance of the surface emitting laser and less heat generation of the device itself, stable characteristic can be provided over a longer period of time compared with existent optical modules.

The effects described above becomes more conspicuous as described above in the surface emitting laser using an active layer material, for example, GaInNAs of excellent temperature characteristic capable of confining electrons by a deep potential well in the active layer.

In the drawing, for optical system in FIG. 9, dotted lines denote partitioning between the light transmission side in which the semiconductor laser is disposed and the light reception side in which the photodetector is disposed but respective portions may sometimes be constituted independently as a light transmission module and a light reception module. Further, the photodetector for use in light output monitor of a surface emitting laser device is saved.

<Embodiment 1 of the Invention>

As a Preferred Embodiment 1, manufacture of a surface emitting laser structure not requiring a regrowth process according to this invention is to be described specifically. The cross sectional view and the upper plan view of the device structure are as shown in FIG. 3 and FIG. 4, respectively. FIG. 10 shows a cross sectional view of a device illustrated in the order of manufacturing steps.

For the manufacture of the surface emitting laser structure, in view of requirement for precise film thickness control or the fabrication of an abrupt hetero interface, a molecular beam epitaxy (MBE) method, a metal organic chemical vapor deposition (MOC MD) method, or chemical beam epitaxy (CBE) method capable of instantaneously switching the materials is suitable. Further, in a case of using GaInNAs for the active layer, a growing method in an inequivalent state is advantageous for the introduction of nitrogen (N) and the MBE method, MOCVD method or CBE method described above is suitable as the growing method also in this regard. It will be apparent that the growing method described above is not limiting the manufacture of the surface emitting laser device according to this invention. In this embodiment, a solid source MBE (SS-MBE; Solid State-Molecular Beam Epitaxy) method was adopted for the growing method. In the SS-MBE method, gallium (Ga) and indium (In) were used as a source for the III group element and metal As was used for arsenic (As) as the source for group V element. Further, silicon (Si) was used as n-type impurity and carbon tetrabromide ($CBr_4$) was used as the impurity material capable of high concentration p-type doping. Providing that the identical doping concentration can be attained, beryllium (Be) or zinc (Zn) may also be used as the p-type impurity. As for the nitrogen (N), nitrogen (N) source radicals formed by RF (Radio Frequency) plasma excitation of $N_2$ gas was used. Excitation of nitrogen plasmas can also be conducted by using ECR (Electron Cyclotron Resonance) plasmas.

Figure 10A:
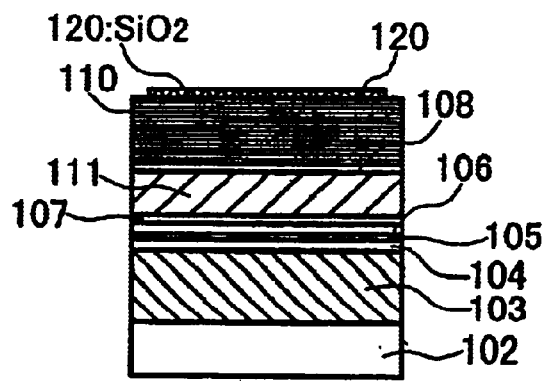
FIG. 10 is a cross sectional view illustrating an example manufacturing step for a surface emitting laser device according to an embodiment of the present invention.

Referring to FIG. 10(a), an n-type GaAs (100) substrate 102 (n-type doping concentration=$2 \times 10^{18}$ $cm^{-3}$) was used for the semiconductor substrate. After elevating the temperature of the substrate in an As atmosphere, a lower semiconductor DBR 103 is layered by 30 periods using n-type AlAs/GaAs (n-type impurity concentration=$1 \times 10^{18}$ $cm^{18}$). AlAs/GaAs means multilayer of an AlAs layer and a GaAs layer. Hereinafter, such indication means similar multilayer. Each film thickness is defined as ¼ wavelength thickness in the semiconductor. Subsequently, there were formed a first spacer layer 104 comprising non-doped GaAs layer at ½ wavelength thickness, an active layer 105 comprising a single layered film of non-doped $Ga_{0.7}In_{0.3}N_{0.01}As_{0.99}$ of 10 nm, a second spacer layer 106 comprising non-doped GaAs layer at ½ wavelength thickness and a non-doped AlAs upper current confinement layer 107 at ¼ wavelength thickness in this order.

Successively, a modulation doped layer 111 comprising AlGaAs/GaAs that particularly forms a characteristic structure of this invention was layered. In the modulation doped layer 111, a non-dope GaAs layer of 25 nm thickness was used as the low concentration dope layer 113, and a p-type AlGaAs layer of 5 nm thickness was used as a high concentration dope layer 112 (p-type doping concentration= $1 \times 10^{19}$ $cm^{-3}$). The Al content in the AlGaAs layer was 30%. This forms a channel of 2-dimensional hole gas is formed at the AlGaAs/GaAs interface. This modulation dope structure was layered repeatedly for 20 times. Successively, a third spacer layer 108 comprising p-type GaAs (p-type doping concentration=$1 \times 10^{18}$ $cm^{-3}$) is formed. The thickness of the third spacer layer 108 was controlled such that the total thickness including the modulation dope structure is an integer multiple of ½ wavelength thickness. Finally, an upper DBR 110 with non-doped AlGaAs/GaAs was layered for 25 periods to complete the crystal growth process. The Al content in the AlGaAs layer of the upper DBR 110 was set to 10%. Further, the film thickness was adjusted to ¼ wavelength in the semiconductor.

Successively, a processing step for manufacture the device structure was applied to the completed multi-layered grown wafer. At first, a silicon dioxide ($SiO_2$) film 120 was vapor deposited over the entire surface and then patterned in a circular form by a photo-etching step. This state shown in FIG. 10(a).

Figure 10D:
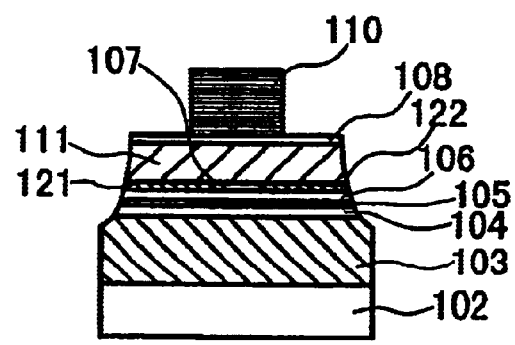
Figure 10B:
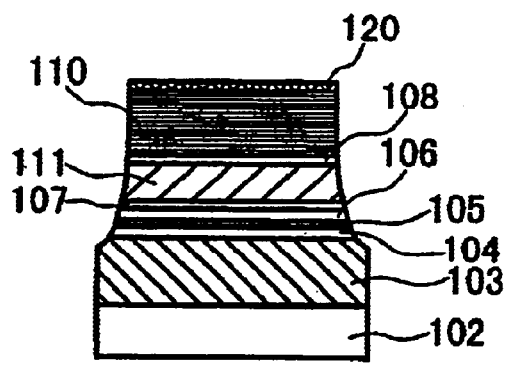
Figure 10E:
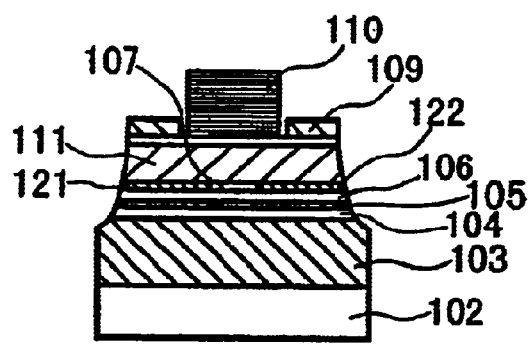
Figure 10C:
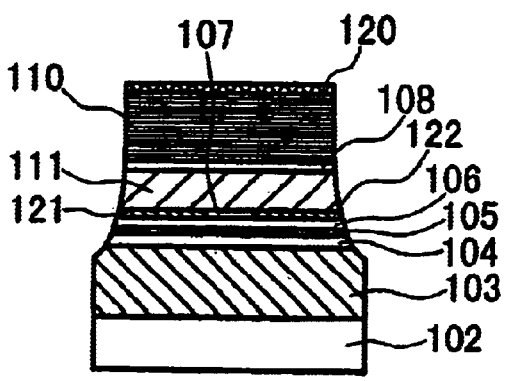
Figure 10F:
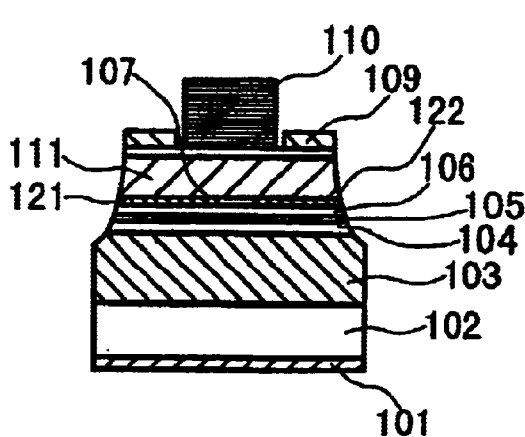

Using the pattern as a mask region, mesa etching is conducted just below the AlAs upper current confinement layer 107 (FIG. 10(b)) As the etching solution, a mixed solution of hydrogen bromide (HBr) aqueous hydrogen peroxide ($H_2O_2$) water ($H_2O$) is used. Successively, selective oxidation is applied to the thus formed mesa structure for confining electric current. The lateral side portions 121, 122 for the AlAs upper current confinement layer 107 were converted into an $Al_xO_y$ insulation layer by heating the wafer to 400° C. in a steam atmosphere. Thus, an apertured portion of 5 μm diameter φ was formed in the central portion of the device (FIG. 10(c)).

Subsequently, the $SiO_2$ film 120 was removed and, by way of the photo-etching step, both sides of the upper DBR 110 were removed by etching to just above the third spacer layer 108 (FIG. 10(d)).

For improving the yield in this etching step, an etching stopper layer comprising aluminum gallium indium phosphide (AlGaInP) at ¼ wavelength thickness may be introduced between the upper DBR 110 and the third spacer layer 108. Finally, a ring-shaped p side upper electrode 109 (FIG. 10(e)) and an n-side lower electrode 101 were formed (FIG. 10(f)) and a surface emitting laser device was completed. In the example shown in FIG. 10, since wet etching was adopted, the mesa shape of the device is somewhat different from the cross section as exemplified in FIG. 3. However, this has no relation with the basic feature of this invention and the device characteristic has no substantial difference. Further, by the use of dry etching, the same cross section as that exemplified in FIG. 3 can be obtained easily.

The thus manufactured surface emitting laser device lases continuously at a lasering wavelength of 1.3 μm and at a threshold current of 0.1 mA at a room temperature, and the device resistance was 9 Ω. The modulation characteristic of this device was satisfactory also at 30 GHz.

Successively, an optical module shown in FIG. 8 was manufactured by using this device. Further, an optical system as shown in FIG. 9 could be constituted.

The optical system according to this invention can decrease the number of parts and the size is small since the device driving circuit is simple and effective. Particularly, use of GaInNAs of good temperature characteristic as the active layer material is one of the reasons. Further, yield upon manufacture of the device is high thereby enabling to attain remarkable reduction of cost. Furthermore, this optical module less degrades the active layer since the resistance of the surface emitting layer is low and heat generation is small. Accordingly, stable characteristic over a longer period of time compared with the existent optical module could be provided.

<Embodiment 2 of the Invention>

Figure 11:
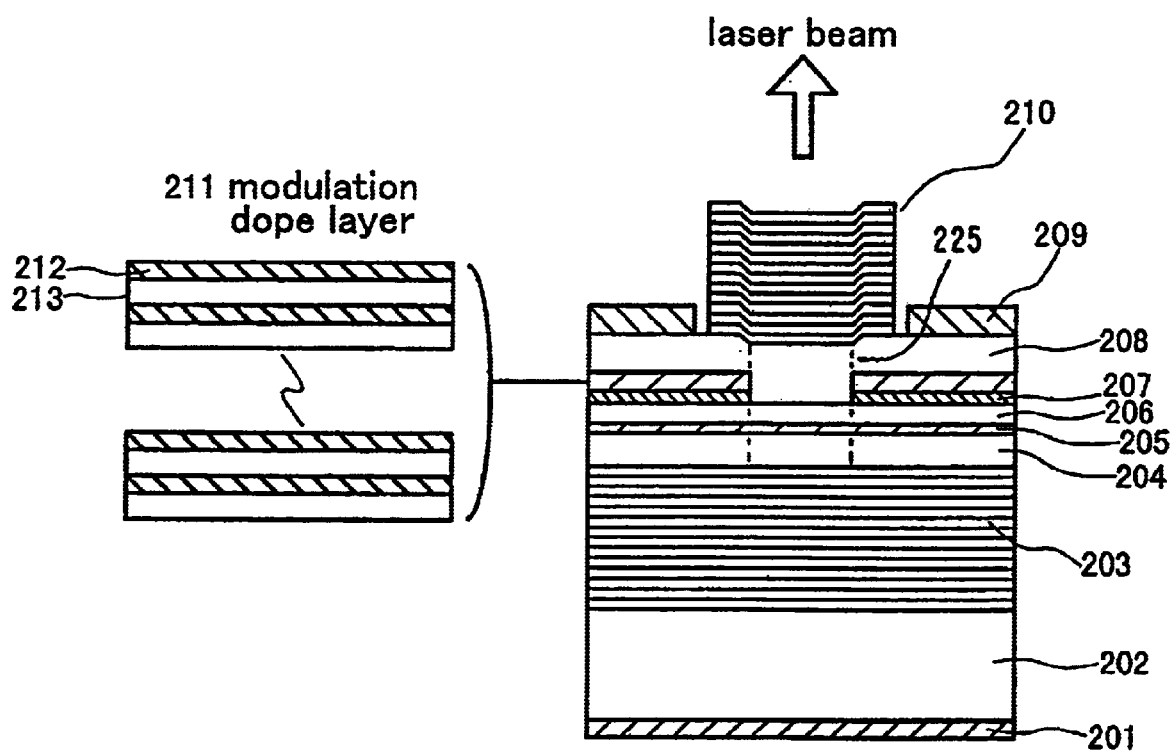
FIG. 11 is a cross sectional view illustrating another example surface emitting laser device according to an embodiment of the present invention.

As an Embodiment 2 of the invention, manufacture of a surface emitting laser structure using the regrowth process according to this invention is to be described specifically. The device structure is as shown in FIG. 11.

The MOCVD method is used for the manufacture of this device structure. Triethyl gallium (TEG) and trimethyl indium (TMI) as organic metals respectively were used as the source for Ga and In of the group III element and $AsH_3$ was used as the source for As of the group V element. Further, silane ($SiH_4$) was used as the n-type impurity and $CBr_4$ as the p-type impurity. Dimethyl hydrazine (DMHy) was used as the N source.

For the semiconductor substrate to be manufactured, a GaAs (100) face substrate (n-type impurity concentration= $1\times10^{18}$ cm$^{-3}$) 202 is used. After elevating the temperature of the substrate in an As atmosphere under the supply of $AsH_3$, a lower DBR 203 with n-type AlAs/GaAs (n-type impurity concentration=$1\times10^{18}$ cm$^{-3}$) is layered by 30 period on the substrate. Each film thickness was controlled respectively to ¼ wavelength thickness in the semiconductor. Subsequently, a first spacer 204 comprising a non-doped GaAs layer at a ½ wavelength thickness and a multiple quantum well active layer 205 comprising a well layer of non-doped $Ga_{0.7}In_{0.4}N_{0.03}As_{0.96}$ of 10 nm thinness and a non-doped GaAs barrier layer of 10 nm thickness were formed. The number of well layers was 3. Successively, a second spacer layer 206 comprising non-doped GaAs layer at ½ wavelength thickness and a current confinement layer 207 comprising an n-type GaInP of 10 nm thickness were formed.

Successively, a modulation dope layer 211 comprising AlGaAs/GaInAs/GaAs as a structure which particularly forms the feature of this invention was layered. As the low concentration dope layer 213 in the modulation dope layer 211, a combined structure of a non-doped GaAs layer at 5 nm thickness and a non-dope GaInAs layer at 5 nm thickness was used, and a p-type AlGaAs layer at 5 nm thickness (p-type doping concentration=$1\times10^{20}$ cm$^{-3}$) was used as the high concentration dope layer 212. The Al content in the AlGaAs layer was set to 40%. This forms a channel with 2-dimensional hole gas mainly in the GaInAs layer. The modulation doped structure described above was layered repeatedly for six times. Successively, a portion of the p-type GaAs third spacer layer 208 (p-type doping concentration= $1\times10^{18}$ cm$^{-3}$) was formed to complete a crystal growth process for the first time.

For the wafer taken out into atmospheric air, a desired pattern was formed by a photo-etching step and the modulation dope layer 211 and the current confinement layer 206 were removed by etching for forming an apertured portion with a diameter φ of 3 μm.

Then, the wafer was introduced again into the growing apparatus and a p-type GaAs third spacer 208 at ½ wavelength thickness (p-type doping concentration=$1\times10^{18}$ cm$^{-3}$) was formed. The step in the apertured portion was about 100 nm and no adverse effect by the step upon regrowth was observed. Finally, an upper DBR 210 with non-doped AlAs/GaAs was layered for 25 periods to complete the crystal growth process. Each film thickness was adjusted to ¼ wavelength thickness in the semiconductor. A processing step for the manufacture of the device structure was applied to the completed multi-layered grown wafer. At first, $SiO_2$ was vapor-deposited over the entire surface, which was patterned by a photolithographic step into a circular shape and, using the pattern as a mask, both sides of the upper DBR 210 were removed by etching to just above the third spacer layer 208. For improving the yield in this etching step, an etching stopper layer comprising AlGaInP at ¼ wavelength thickness may be introduced between the upper DBR 210 and the third spacer layer 208. Finally, a ring-shaped p-side upper electrode 209 and an n-side lower electrode 201 were formed to complete as a device.

The thus manufactured surface emitting laser device oscillated continuously at a lasering wavelength of 1.3 μm and at a threshold current of 0.1 mA at a room temperature and a device resistance was 8 Ω. The modulation characteristic of this device was satisfactory also at 30 GHz.

For reducing the contact resistance between the third spacer 208 and the p-side electrode 209, it is effective to apply carbon (C) delta doping with $CBr_4$ after growing the third spacer layer 208.

The optical module shown in FIG. 8 was manufactured by using this device. Further, an optical system as in FIG. 9 could be constituted. Like that in Embodiment 1, it had high performance and long life. Furthermore, the cost for the module itself could be reduced remarkably.

While explanations have been made in this embodiment only to the example of using GaInNAs as the active layer but it is not restricted only thereto and it will be apparent that various kinds of surface emitting semiconductor laser devices can be provided. For instance, a surface emitting laser device at 1.3 μm range can be provided by using a material such as GaAsSb. Further, as described previously, when AlGaAs or the like at high Al content is used as the low concentration dope layer, the material itself becomes transparent to light at 1 μm wavelength or less, which is applicable also to surface emitting lasers at wavelength of 1 μm or less. Similar effect can also be obtained also on an indium phosphide (InP) substrate providing that there is a satisfactory combination of semiconductor materials capable of forming 2-dimensional carriers. This can provide an optical module of high performance and reduced cost.

As has been described above with reference to each of the preferred embodiments, according to this invention, the high speed optical module using the surface emitting laser as a light source can be improved in the performance and reduced in the cost by the remarkable lowering of the device resistance in the surface emitting laser. The surface emitting laser of such low resistance can be attained by a structure having, on a semiconductor substrate, an active layer for generating light, a current confinement region disposed on the side opposite to the substrate relative to the active layer and a cavity comprising reflectors putting the active layer and the current confinement region vertically therebetween, in which the current flowing from the electrode disposed on the side opposite to the substrate relative to the current confinement region to the current confinement region has a component in the horizontal direction relative to the surface of the substrate and the current component in the horizontal direction is conducted mainly by way of the channel for the 2-dimensional carrier gas. Specifically, this can be attained by introducing a modulation dope layer between the current confinement layer and the upper electrode.

According to this invention, it is possible to provide a surface emitting semiconductor laser capable of high speed operation. This invention can attain a high speed, for example, of 10 Gb/s or higher.

According to this invention, it is possible to provide an optical module for mounting thereon a surface emitting semiconductor laser device capable of higher speed operation.

What is claimed is:

1. A surface emitting laser device for generating a laser beam, comprising:
   a semiconductor substrate;
   an active region disposed on the semiconductor substrate;
   a current confinement region disposed on the active region;
   an optical cavity comprising reflectors putting the active region and the current confinement region vertically therebetween;
   a first electrode disposed on the side of the semiconductor substrate relative to the current confinement region;
   a second electrode disposed on the side opposite to the semiconductor substrate relative to the current confinement region; and
   a semiconductor region having a layered structure capable of forming a channel for 2-dimensional carriers between the current confinement region and the second electrode, the semiconductor region having at least a first semiconductor layer containing impurities at a high concentration and having a wide band gap and a second semiconductor layer containing impurities at a lower concentration and having a band gap narrower than that of the first semiconductor layer.

2. A surface emitting laser device as claimed in claim 1 wherein at least a portion of the semiconductor region is contained in the optical cavity.

3. A surface emitting laser device as claimed in claim 2 wherein the semiconductor region absorbs less than 1% of the laser beam.

4. A surface emitting laser device for generating a laser beam, comprising:
   a semiconductor substrate;
   an active region disposed on the semiconductor substrate;
   a current confinement region disposed on the active region;
   an optical cavity comprising reflectors putting the active region and the current confinement region vertically therebetween;
   a first electrode disposed on the side of the semiconductor substrate relative to the current confinement region;
   a second electrode disposed on the side opposite to the semiconductor substrate relative to the current confinement region; and
   a semiconductor region having a layered structure capable of forming a channel for 2-dimensional carriers between the current confinement region and the second electrode, in which a current flowing from the second electrode to the current confinement region has a component in a horizontal direction relative to the surface of the semiconductor substrate, and is conducted via the channel for the 2-dimensional carriers, the semiconductor region having at least a first semiconductor layer containing impurities at a high concentration and having a wide band gap and a second semiconductor layer containing impurities at a concentration lower than that of the first semiconductor layer or substantially not containing impurities and having a band gap narrower than that of the first semiconductor layer.

5. A surface emitting laser device as claimed in claim 1, wherein the first semiconductor layer is a p-conduction type layer, and carriers in the semiconductor region are holes.

6. A surface emitting laser device as claimed in claim 2, wherein the first semiconductor layer is a p-conduction type layer, and carriers in the semiconductor region are holes.

7. A surface emitting laser device as claimed in claim 3, wherein the first semiconductor layer is a p-conduction type layer and carriers in the semiconductor region are holes.

8. An optical module comprising:
   a surface emitting laser device arranged to generate a laser beam;
   a modulator for modulating the laser beam and transmitting the laser beam through an optical fiber;
   a laser driver circuit for driving said surface emitting laser device;
   a photo-detector arranged to detect an optical signal from the optical fiber; and
   a photo-detector driver circuit for driving said photo-detector to detect the optical signal from the optical fiber,
   wherein said surface emitting laser device comprises:
      a semiconductor substrate;
      an active disposed on the semiconductor substrate;
      a current confinement region disposed on the active region;
      an optical cavity comprising a reflectors putting the active region and the current confinement region vertically therebetween;
      a first electrode disposed on the side of the semiconductor substrate relative to the current confinement region;
      a second electrode disposed on the side opposite to the semiconductor substrate relative to the current confinement region; and
      a semiconductor region having a layered structure capable of forming a channel for 2-dimensional carriers between the current confinement region and the second electrode, the semiconductor region having at least a first semiconductor layer containing impurities at a high concentration and having a wide band gap and a second semiconductor layer containing impurities at a lower concentration and having a band gap narrower than that of the first semiconductor layer.

9. An optical system comprising:
   a surface emitting laser device arranged to generate a laser beam;

a modulator for modulating the laser beam and transmitting the laser beam through an optical fiber;

a laser driver circuit for driving the surface emitting laser device;

a photo-detector arranged to detect an optical signal from the optical fiber; and a photo-detector driver circuit for driving the photo-detector to detect the optical signal from the optical fiber, wherein said surface emitting laser device comprises:
a semiconductor substrate;
an active region disposed on the semiconductor substrate;
a current confinement region disposed on the active region;
an optical cavity comprising reflectors putting the active region and the current confinement region vertically therebetween;
a first electrode disposed on the side of the semiconductor substrate relative to the current confinement region;
a second electrode disposed on the side opposite to the semiconductor substrate relative to the current confinement region; and
a semiconductor region having a layered structure capable of forming a channel for 2-dimensional carriers between the current confinement region and the second electrode, in which a current flowing from the second electrode to the current conferment region has a component in a horizontal direction relative to the surface of the semiconductor substrate, and is conducted via the channel for the 2-dimensional carriers, the semiconductor region having at least a first semiconductor layer containing impurities at a high concentration and having a wide band gap and a second semiconductor layer containing impurities at a concentration lower than that of the first semiconductor layer or substantially not containing impurities and having a band gap narrower than that of the first semiconductor layer.

10. A surface emitting laser device as claimed in claim 1 wherein the reflectors are semiconductor distributed Bragg reflectors formed by alternatively stacking semiconductor layers of different refractive indexes at ¼ wavelength thickness.

11. A surface emitting laser device as claimed in claim 4 wherein the reflectors are semiconductor distributed Bragg reflectors formed by alternatively stacking semiconductor layers of different refractive indexes at ¼ wavelength thickness.

12. A surface emitting laser device as claimed in claim 4 wherein the semiconductor region having a layered structure absorbs less than 1% of the laser beam.

13. A surface emitting laser device as claimed in claim 4 wherein the layered structure of the semiconductor region is disposed inside the optical cavity.

14. A surface emitting laser device as claimed in claim 4 wherein the layered structure of the semiconductor region is disposed outside the optical cavity.

15. An optical module comprising:
a surface emitting laser device for generating a laser beam through an optical fiber;
a laser driving circuit for driving said surface emitting laser device;
a photo-detector for detecting an optical signal from the optical fiber; and
a photo-detector driving circuit for driving said photo-detector;

wherein said surface emitting laser device comprises:
a semiconductor substrate;
an active region disposed on the semiconductor substrate;
a current confinement region disposed on the active region;
an optical cavity comprising reflectors putting the active region and the current confinement region vertically therebetween;
a first electrode disposed on the side of the semiconductor substrate relative to the current confinement region;
a second electrode disposed on the side opposite to the semiconductor substrate relative to the current confinement region; and
a semiconductor region having a layered structure capable of forming a channel for 2-dimensional carriers between the current confinement region and the second electrode, in which a current flowing from the second electrode to the current conferment region has a component in a horizontal direction relative to the surface of the semiconductor substrate, and is conducted via the channel for the 2-dimensional carriers, the semiconductor region having at least a first semiconductor layer containing impurities at a high concentration and having a wide band gap and a second semiconductor layer containing impurities at a concentration lower than that of the first semiconductor layer or substantially not containing impurities arid having a band gap narrower then that of the first semiconductor layer.

16. An optical system comprising:
a surface emitting laser device for generating a laser beam;
a photo-detector; and
an optical fiber connected between said surface emitting laser device and said photo-detector;
wherein said surface emitting laser device comprises:
a semiconductor substrate;
an active region disposed on the semiconductor substrate;
a current confinement region disposed on the active region;
an optical cavity comprising reflectors putting the active region and the current confinement region vertically therebetween;
a first electrode disposed on the side of the semiconductor substrate relative to the current confinement region;
a second electrode disposed on the side opposite to the semiconductor substrate relative to the current confinement region; and
a semiconductor region having a layered structure capable of forming a channel for 2-dimensional carriers between the current confinement region and the second electrode, in which a current flowing from the second electrode to the current confinement region has a component in a horizontal direction relative to the surface of the semiconductor substrate, and is conducted via the channel for the 2-dimensional carriers, the semiconductor region having at least a first semiconductor layer containing impurities at a high concentration and having a wide band gap and a second semiconductor layer containing impurities at a concentration lower than that of the first semiconductor layer or substantially not containing impurities and having a band gap narrower than that of the first semiconductor layer.

17. A surface emitting laser device as claimed in claim 1, wherein the layered structure of the semiconductor region is disposed outside the optical cavity.

18. A surface emitting laser device as claimed in claim 13, wherein the semiconductor region having a layered structure absorbs less than 1% of the laser beam.

* * * * *